United States Patent
Li et al.

(10) Patent No.: US 8,416,540 B1
(45) Date of Patent: Apr. 9, 2013

(54) METHOD FOR DEFINING A MAGNETORESISTIVE JUNCTION USING MULTIPLE MILLS AT A PLURALITY OF ANGLES

(75) Inventors: Guanxiong Li, Fremont, CA (US); Xiaozhong Dang, Fremont, CA (US); Mahendra Pakala, Fremont, CA (US); Yong Shen, Saratoga, CA (US)

(73) Assignee: Western Digital (Fremont), LLC, Fremont, CA (US)

(*) Notice: Subject to any disclaimer, the term of this patent is extended or adjusted under 35 U.S.C. 154(b) by 1162 days.

(21) Appl. No.: 12/147,450

(22) Filed: Jun. 26, 2008

(51) Int. Cl.
*G11B 5/39* (2006.01)
(52) U.S. Cl. .............. 360/324.2; 29/603.14; 29/603.15
(58) Field of Classification Search .............. 360/324.1, 360/324.11, 324.12, 324.2, 313; 29/603.07, 29/603.15, 603.18, 603.12, 603.14
See application file for complete search history.

(56) References Cited

U.S. PATENT DOCUMENTS

| | | | |
|---|---|---|---|
| 6,538,858 B1 | 3/2003 | Hasegawa et al. |
| 6,643,107 B1 | 11/2003 | Hasegawa et al. |
| 6,663,987 B2 | 12/2003 | Kakihara et al. |
| 6,700,759 B1 | 3/2004 | Knapp et al. |
| 6,713,237 B2 | 3/2004 | Seigler et al. |
| 6,795,280 B1 | 9/2004 | Song et al. |
| 6,847,508 B2 | 1/2005 | Tanaka et al. |
| 7,002,782 B2 | 2/2006 | Hasegawa et al. |
| 7,042,684 B2 | 5/2006 | Horng et al. |
| 7,043,823 B2 | 5/2006 | Childress et al. |
| 7,081,041 B1 | 7/2006 | Guthrie et al. |
| 7,194,797 B2 | 3/2007 | Pinarbasi |
| 7,212,384 B1 | 5/2007 | Stoev et al. |
| 7,218,485 B2 | 5/2007 | Hasegawa et al. |
| 7,218,487 B2 | 5/2007 | Hasegawa et al. |
| 7,268,985 B2 | 9/2007 | Freitag et al. |
| 7,367,110 B2 | 5/2008 | Cyrille et al. |
| 2002/0015268 A1 | 2/2002 | Mao et al. |
| 2003/0030947 A1 | 2/2003 | Ooshima |
| 2003/0231437 A1 | 12/2003 | Childress et al. |
| 2004/0223267 A1 | 11/2004 | Childress et al. |
| 2005/0264957 A1 | 12/2005 | Li et al. |
| 2006/0067009 A1 | 3/2006 | Cyrille et al. |
| 2006/0094129 A1 | 5/2006 | Pinarbasi |
| 2006/0291097 A1 | 12/2006 | Honda et al. |
| 2007/0056160 A1 | 3/2007 | Pinarbasi |
| 2007/0081279 A1 | 4/2007 | Hong et al. |
| 2007/0206333 A1* | 9/2007 | Watanabe et al. .............. 360/313 |
| 2007/0217077 A1* | 9/2007 | Kanaya et al. ................. 360/313 |
| 2007/0253117 A1* | 11/2007 | Takei et al. .................... 360/313 |
| 2007/0266549 A1 | 11/2007 | Gill et al. |
| 2009/0046394 A1* | 2/2009 | Okamoto et al. ............. 360/319 |
| 2011/0198314 A1* | 8/2011 | Wang et al. ..................... 216/22 |

* cited by examiner

*Primary Examiner* — Jefferson Evans

(57) ABSTRACT

A method and system define a magnetoresistive junction in a magnetic recording transducer. The method and system include performing a first mill at a first angle from a normal to the surface of the magnetic recording transducer. A second mill is performed at a second angle from the normal to the surface. The second angle is larger than the first angle. A third mill is performed at a third angle from the normal to the surface. The third angle is not larger than the first angle.

13 Claims, 4 Drawing Sheets

150

152
Perform First Ion Mill at a First Angle of at Least 12 and Not More Than 30 Degrees from Normal to the Surface of the Magnetic Recording Transducer, Terminating Before Pinned Layer is Milled Through 154
Perform Second Mill at a Second Angle from Normal to the Surface of the Magnetic Recording Transducer, with the Second Angle Being at Least Sixty and Not More Than Eighty Degrees From Normal, Terminating Before Bottom Layer is Milled Through 156
Perform Third Mill at a Third Angle from Normal to the Surface of the Magnetic Recording Transducer, with the Third Angle Being Not More Than Nine Degrees

METHOD FOR DEFINING A MAGNETORESISTIVE JUNCTION USING MULTIPLE MILLS AT A PLURALITY OF ANGLES

BACKGROUND

FIG. 1 depicts a conventional magnetoresistive transducer 1 including a conventional magnetoresistive junction 10. For clarity, FIG. 1 is not drawn to scale. Magnetoresistive junctions 10, such as tunneling magnetoresistive (TMR) junctions, are used as read sensors in the conventional read transducer 1. Typically, conventional magnetoresistive junctions are formed by blanket depositing the layers for the conventional magnetoresistive junctions. This stack of layers typically includes layers for pinning layer 12 such as an antiferromagnetic (AFM) layer, a magnetic pinned layer 14, a nonmagnetic spacer layer 16, and a magnetic free layer 18. Other layers (not shown) might also be included in the magnetoresistive junction. For a conventional TMR junction 10, the nonmagnetic spacer layer 16 is a tunneling barrier layer. The barrier layer 16 is typically an insulator, for example aluminum oxide. After formation of the stack, a mask (not shown) is provided. The mask is typically a single layer photoresist mask with no undercut. The mask substantially covers the portion of the stack which is to become the conventional magnetoresistive junction 10. A remaining portion of the layers in the stack are then removed to define the conventional magnetoresistive junction 10. In such conventional methods, ion milling is the prevailing mechanism for defining the conventional magnetoresistive junction 10.

A single milling angle, $\phi 1$, is typically selected for defining the conventional magnetoresistive junction 10. This milling angle is typically at least five degrees and not more than thirty degrees from normal to the surface of the transducer. The single-angle milling proceeds until the stack has been completely milled through. Thus, the conventional magnetoresistive junction 10 is substantially defined. Because this single-angle ion milling often leads to redeposition of removed material on the sides of the conventional junction 10 and mask, a second, cleanup ion mill may be performed. This second ion mill is typically short in duration and performed at a high angle milling angle, $\phi 2$. For example, the angle is typically greater than sixty degrees from normal to the surface of the read transducer.

Although the conventional ion milling may define the conventional magnetoresistive junction 10, there are drawbacks. Ion milling may cause damage to the layers in a stack, particularly to oxide layers. Thus, the first, single-angle ion mill may damage the barrier layer 16 when the conventional magnetoresistive junction 10 is defined. This damage to the barrier layer 16 may adversely affect performance of the magnetoresistive junction 10. In addition, if the redeposition is not cleaned by the second ion milling, then metallic redeposition across the barrier layer 16 may result in shorting of the magnetoresistive junction 10. However, if the redeposition is cleaned, then the additional ion mill may further damage the barrier layer 16.

In addition, the damage due to ion milling may vary based on junction angle, $\theta$, of the magnetoresistive junction 10 as well as on the milling angle, $\phi$. The ion milling damage to the barrier layer 16 of the conventional magnetoresistive junction 10 occurs when the junction width is close to its final value. This is because portions of the stack damaged far from the final width of the conventional magnetoresistive junction 10 are removed during ion milling. As a result, ion milling damage is generally smaller for a shallow magnetoresistive junction (small junction angle $\theta$ and large milling angle $\phi$) than for a steep magnetoresistive junction (large junction angle $\theta$ and small milling angle $\phi$)). This is because the shallow junction 10 is typically milled using a high milling angle $\phi 1$. As a result, the junction width for a shallow magnetoresistive junction 10 reaches its final value only when the single-angle milling comes towards its end. In contrast, for a larger junction angle $\theta$ formed using a small milling angle $\phi 1$, the width quickly gets close to its final value. As a result, the barrier layer 16 is exposed to more milling during the single-angle mill and experiences greater damage. Thus, a conventional magnetoresistive junction that has a steep (large) junction angle and/or which is formed using a small milling angle is more likely to be damaged during ion milling that defines the junction.

The conventional ion mill process may also create an undesirable junction profile. The single-angle ion mill or the single-angle ion mill in combination with the second ion mill may result in a kink 19, or step, at the barrier layer 16. This profile is due to the redeposition during the single-angle ion mill and different milling rates of the stack layers. For example, the barrier layer 16 typically mills at a different rate than the pinned layer 14 or free layer 18. Consequently, especially for a shallow junction angle, the kink 19 may occur. This junction profile with a kink 19 at the barrier layer 16 is undesirable because it adversely affects biasing of the magnetoresistive junction 10 by the hard bias structure (not shown). Consequently, performance of the read transducer 10 may be adversely affected.

Further, the trend in magnetic recording is to higher densities and, therefore, smaller junction widths. For example, current ultra-high density magnetic recording of approximately five hundred $GB/in^2$ or more utilizes a TMR junction 10 having a width of not more than fifty nanometers. The junction width is desired not only to be small, but to have limited variations in order to maintain performance. Using the conventional single-angle ion milling, the junction width is primarily determined by the width of the mask used during ion milling. This is generally true whether or not the second ion mill is performed. At higher densities, the photolithography utilized to repeatably obtain a mask having a small width with limited variations may be difficult to achieve. Consequently, fabrication of the conventional magnetoresistive junction 10 may be more problematic.

There are conventional mechanisms for accounting for ion mill induced damage. Damage caused by the single angle ion mill that defines the junction and the second, cleanup ion mill may be repaired by an oxidation. However, such an oxidation may result in a relatively thick oxidation layer on the sides of the conventional magnetoresistive junction 10. Consequently, biasing of the magnetoresistive junction using a hard bias layer (not shown in FIG. 1) may be adversely affected.

Accordingly, what is needed is a system and method for providing an improved magnetoresistive junction.

BRIEF SUMMARY OF THE INVENTION

A method and system define a magnetoresistive junction in a magnetic recording transducer. The method and system include performing a first mill at a first angle from a normal to the surface of the magnetic recording transducer. A second mill is performed at a second angle from the normal to the surface. The second angle is larger than the first angle. A third mill is performed at a third angle from the normal to the surface. The third angle is not larger than the first angle.

DETAILED DESCRIPTION OF THE PREFERRED EMBODIMENTS

Figure 1:
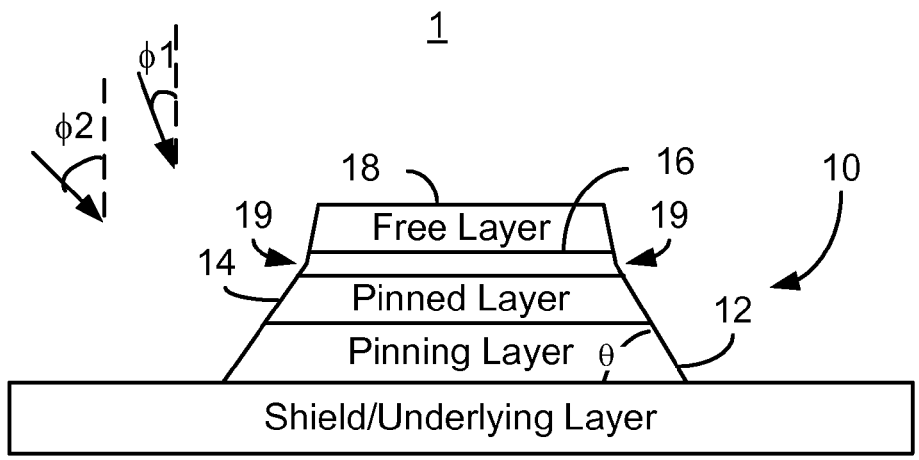
FIG. 1 depicts a conventional magnetic read transducer.
Figure 2:
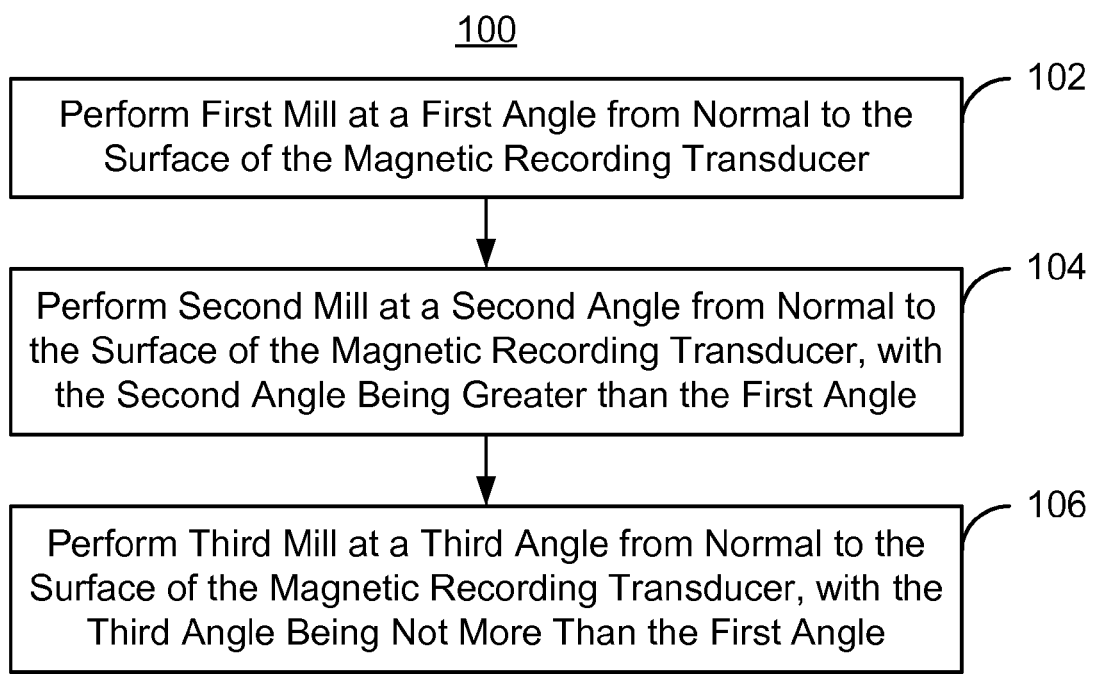
FIG. 2 is a flow chart of an exemplary embodiment of a method for defining a junction.

FIG. 2 is a flow chart of an exemplary embodiment of a method 100 for defining a magnetoresistive junction. For simplicity, some steps may be omitted. The magnetoresistive junction may be part of a read transducer (not shown in FIG. 1). The read transducer may be part of a merged head that also includes a write transducer (not shown in FIG. 1) and resides on a slider (not shown in FIG. 1). The method 100 also may commence after formation of other structures of the read and/or write transducer. The method 100 is also described in the context of providing a single magnetoresistive junction. However, the method 100 may be used to fabricate multiple magnetoresistive junctions at substantially the same time. The method 100 is also described in the context of particular layers. However, in some embodiments, such layers may include sub-layer(s) and the magnetoresistive junction may include additional layers. For example, a free or pinned layer may be a synthetic layer including multiple ferromagnetic layers separated by nonmagnetic spacer layers. Similarly, the magnetoresistive junction may be a TMR junction. The method 100 commences after formation of a stack of layers for the magnetoresistive junction is formed. In one embodiment, these layers are formed on a shield. In one embodiment, the stack includes at least a pinning layer such as an AFM layer, a magnetic pinned layer, a nonmagnetic spacer layer that may be a barrier layer, a free layer, and optional seed and/or capping layer(s). The method 100 also begins after a mask has been formed on the stack. The mask is used to cover the portion of the stack from which the magnetoresistive junction is formed.

A first mill is performed at a first angle from normal to the surface of the read transducer, via step 102. Thus, for an ion mill performed in step 102, the ions are incident on the magnetoresistive stack at the first angle from the normal. In one embodiment, the first angle is at least twelve degrees and not more than thirty degrees from normal. In one such embodiment, the first angle is at least seventeen degrees and not more than twenty-five degrees from normal. In one embodiment, the first mill is terminated after at least a portion of the junction including the barrier layer is defined. Thus, the first mill exposes at least the free layer and the barrier layer in a TMR junction in which the pinned layer is closer to the underlying substrate. In one such embodiment, the first ion mill is terminated after the layer immediately below the barrier layer is defined. Stated differently, the first mill would be terminated before another portion of the magnetoresistive junction including the layer immediately below the barrier layer is completely defined. In one embodiment, therefore, the first mill may be terminated before the pinned layer is milled through and this portion of the junction completely defined.

After termination of the first mill, a second mill is performed at a second angle from normal to the surface of the read transducer, via step 104. For an ion mill performed in step 104, the ions are incident on the magnetoresistive stack at the second angle from the normal. This second angle is greater than the first angle. In one embodiment the second angle is at least sixty degrees and not more than eighty degrees. In one such embodiment, the second angle is at least seventy degrees from normal. In one embodiment, the second mill is terminated before the junction is completely defined. Thus, in such an embodiment, the second mill is terminated before the pinning layer is completely milled through.

A third mill is performed at a third angle from normal to the surface of the read transducer after termination of the second mill, via step 106. Thus, for an ion mill performed in step 106, the ions are incident on the magnetoresistive stack at the third angle from the normal. The third angle is not larger than the first angle. In one embodiment, the third angle is smaller than the first angle. In one embodiment, the third angle is not more than twelve degrees. In one such embodiment, the third angle is at least three degrees and not more than nine degrees from normal. In one embodiment, the third mill is terminated after the magnetoresistive junction is completely defined.

Using the method 100, the magnetoresistive junction may be defined. Moreover, the magnetoresistive junction, particularly the barrier layer, may exhibit less damage. The first mill may be performed at a relatively large angle. The second mill is performed at an even larger angle. As described above, a larger angle from normal results in less damage to the junction. Using the method 100, therefore, less damage may be done to the junction while a significant portion of the junction is being defined. For example, in one embodiment, at least the free and barrier layers are defined substantially defined in the first and second mills. Thus, these layers may exhibit less damage due to ion milling. Further, the second mill may be performed at a sufficiently high angle to remove redeposition that has built up during the first mill. Thus, less damage and less redeposition may be result in the final device. Because less damage may be done during definition of the magnetoresistive junction, oxidation steps meant to repair such damage may be skipped or reduced in strength. For example, a natural oxidation instead of a plasma oxidation may be sufficient. Consequently, processing may be simplified and thick oxide layers at the sides of the junction may be reduced or avoided. Furthermore, the third mill may be performed at a lower angle from normal to the surface. Although this third mill may be more likely to damage the magnetoresistive junction, it may be performed for a relatively short time. This is because the first two mills have already defined a significant portion of the junction. The third mill allows the junction angle and the width for the magnetoresistive junction to be tailored substantially as desired. In particular, a steeper junction may be achieved. Further, the width of the magnetoresistive junction may be adjusted in the second mill without reducing the size of the mask used in defining the junction. As a result, photolithography parameters may be relaxed. Fabrication may, therefore, be simplified.

Figure 3:
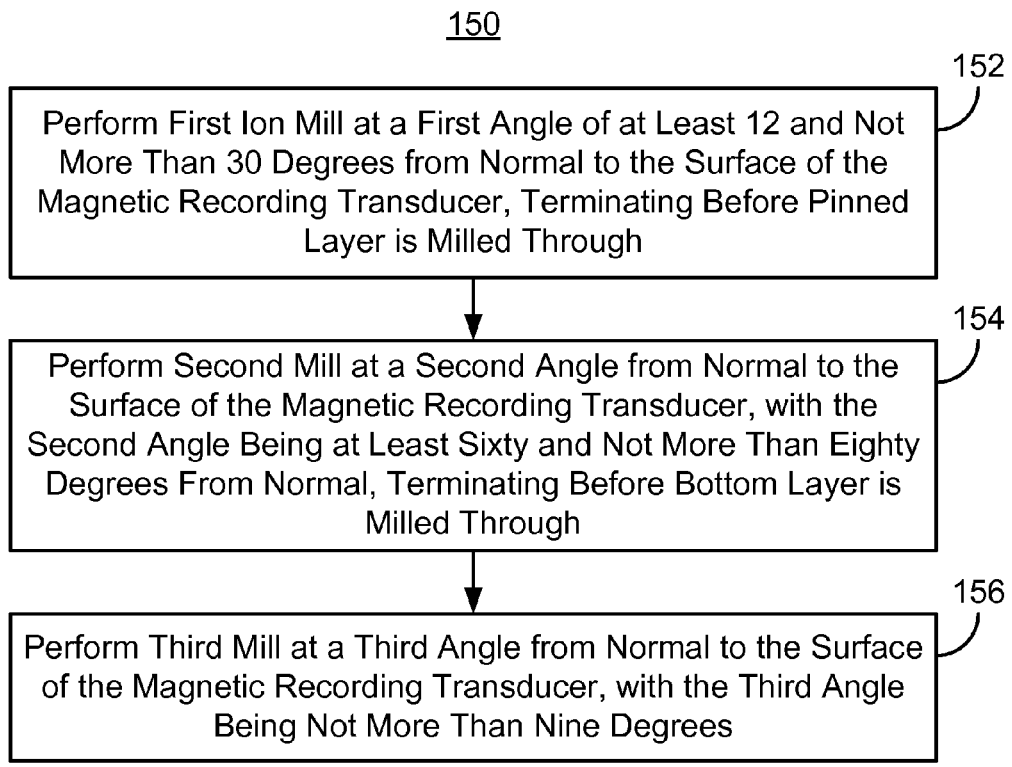
FIG. 3 depicts another exemplary embodiment of a method for defining a junction.

FIG. 3 depicts another exemplary embodiment of a method 150 for defining a junction. For simplicity, some steps may be omitted. FIGS. 4-8 depict an exemplary embodiment of a magnetoresistive junction that is part of a read transducer 200 during fabrication. FIGS. 4-8 are not drawn to scale. The method 150 is described in the context of the read transducer 200. Referring to FIGS. 3-8, the read transducer 200 may be part of a merged head that also includes a write transducer (not shown in FIGS. 4-8) and resides on a slider (not shown in FIGS. 4-8). The read transducer also includes a shield 202. The method 150 also may commence after formation of other structures of the read and/or write transducer. The method 150 is also described in the context of providing a single magnetoresistive junction. However, the method 150 may be used to fabricate multiple magnetoresistive junctions at substantially the same time.

Figure 4:
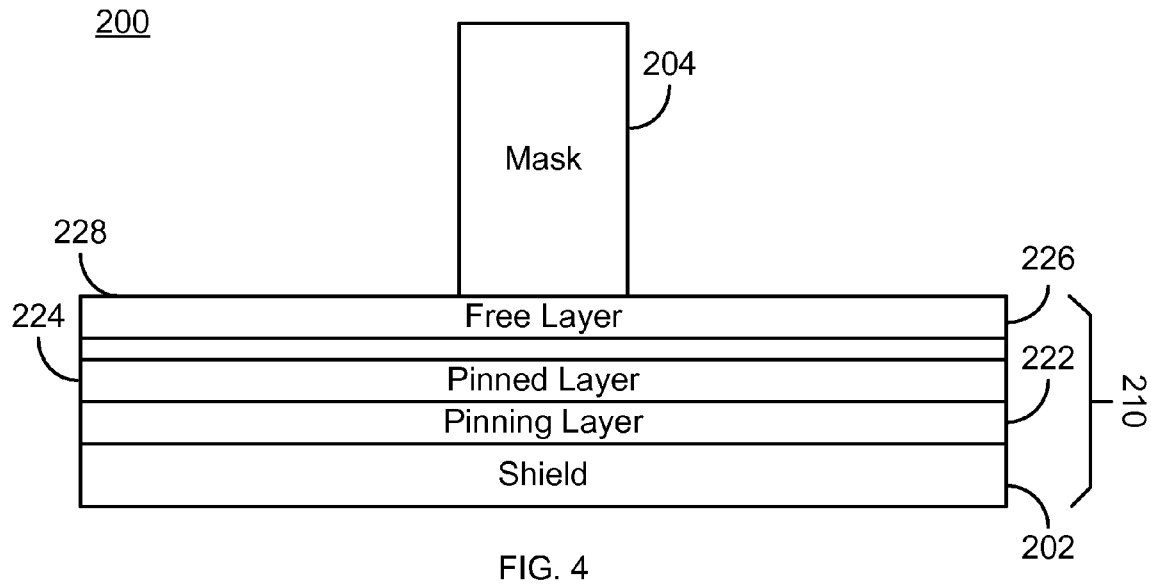
FIGS. 4-8 depict an exemplary embodiment of a magnetoresistive junction during fabrication.

FIG. 4 depicts the read transducer 200 before the method 150 commences. Thus, a stack 210 of layers for the magnetoresistive junction is shown. In the embodiment shown, these layers are formed on the shield 202. The stack includes at least a pinning layer such as an AFM layer 222, a magnetic pinned layer 224, a nonmagnetic spacer layer that may be a barrier layer 226, a free layer 228, and optional seed and/or capping layer(s) (not shown). The stack 210 shown includes particular layers. However, in some embodiments, such layers may include sub-layer(s) and the stack 210 may include additional layers. For example, a free layer 228 and/or pinned layer 224 may be a synthetic layer including multiple ferromagnetic layers separated by nonmagnetic spacer layers. Similarly, the magnetoresistive junction formed from the stack 210 may be a TMR junction. Alternatively, a conductive spacer layer might be used. Also shown in FIG. 4 is a mask 204 formed on the stack 210. The mask 204 is used to cover the portion of the stack 210 from which the magnetoresistive junction is formed. In one embodiment, the mask 204 is a single layer photoresist mask with no undercut.

Figure 5:
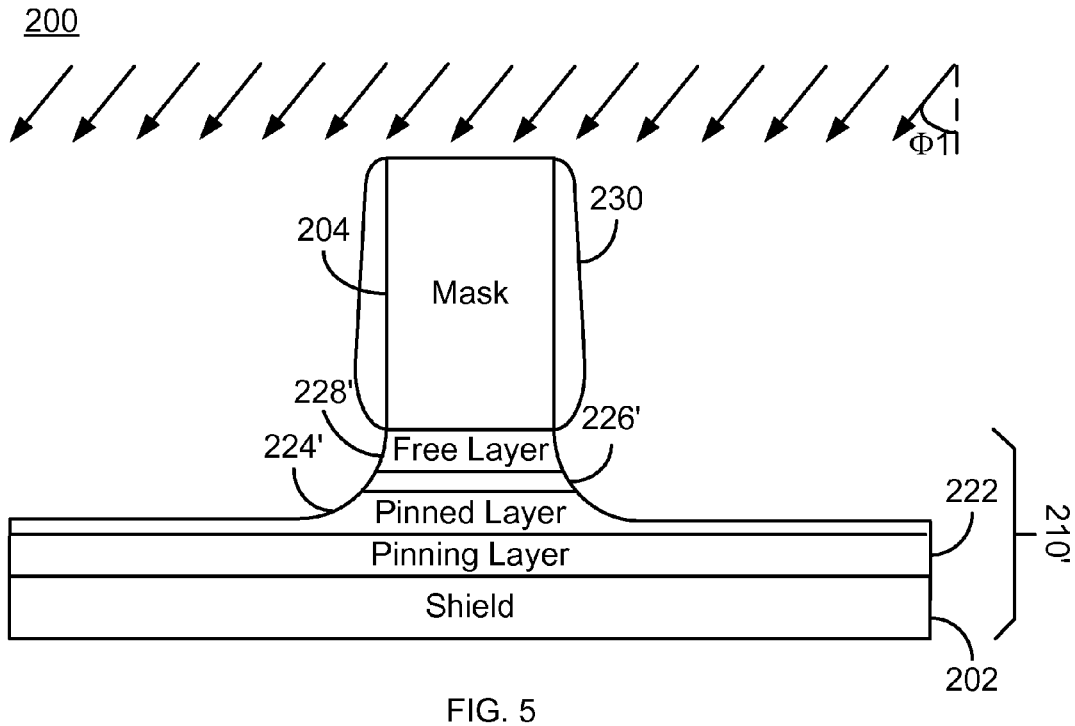

A first ion mill is performed at a first angle, $\Phi 1$ of at least twelve and not more than thirty degrees from normal to the surface of the read transducer, via step 152. In one embodiment, the first angle is at least seventeen degrees and not more than twenty-five degrees from normal. Also in step 152, the first mill is terminated after at least a portion of the junction including the barrier layer 224 is defined but before the pinned layer 222 has been completely milled through. FIG. 5 depicts the read transducer 200 during step 152. Thus, the ions are incident on the magnetoresistive stack 210' at the first angle, $\Phi 1$, from the normal. In addition, free layer 228' and barrier layer 226' have been substantially defined from the stack 210'. A portion of the pinned layer 224' has also been defined. However, a portion of the pinned layer 224' remains unmilled. In addition, redeposition 230 has built up on the mask 204. Although not specifically shown, redeposition may also reside on the portion of the stack 210'.

Figure 6:
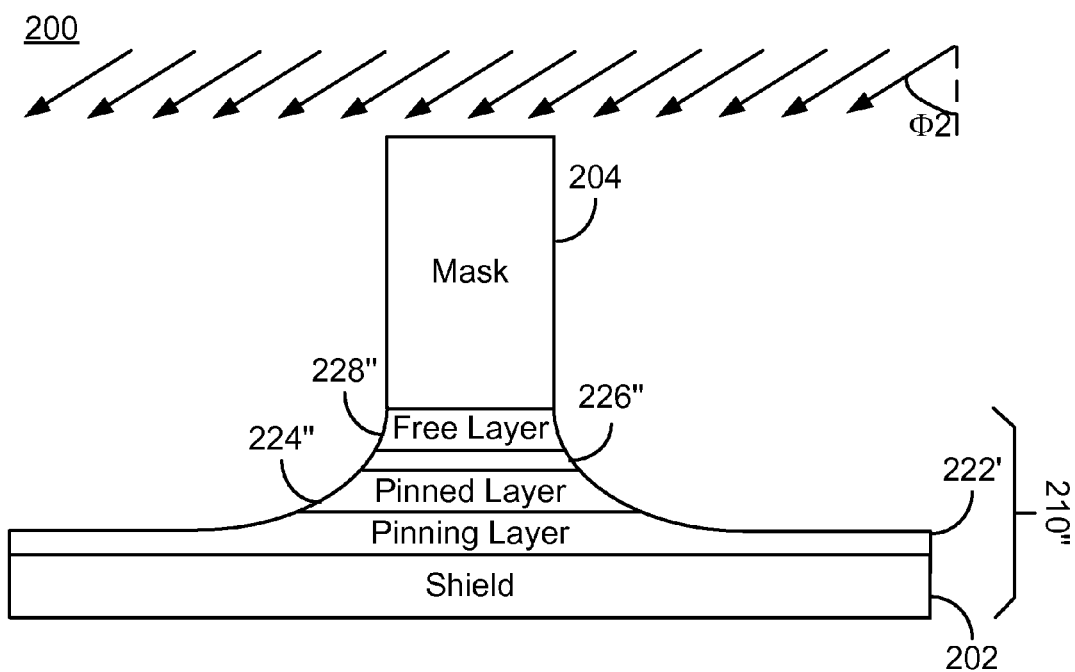

After termination of the first ion mill, a second ion mill is performed at a second angle of at least sixty degrees from normal to the surface of the magnetoresistive stack 210', via step 154. In one such embodiment, the second angle is at least seventy degrees and not more than eighty degrees from normal. Also in step 154, the second mill is terminated before the pinning layer 222 is completely milled through. FIG. 6 depicts the read transducer 200 during step 154. Definition of the magnetoresistive stack 210" has continued. Thus, the ions are incident on the magnetoresistive stack 210" at the second angle, $\Phi 2$, from the normal. In addition, to the free layer 228" and barrier layer 226" being defined, the pinned layer 224" has been substantially defined from the stack 210". However, in the embodiment shown, a portion of the pinning layer 224" remains unmilled. In another embodiment, a portion of the pinned layer 224" may also remain unmilled. Further, because the second milling is performed at a higher milling angle, the redeposition 230 has been substantially removed.

Figure 7:
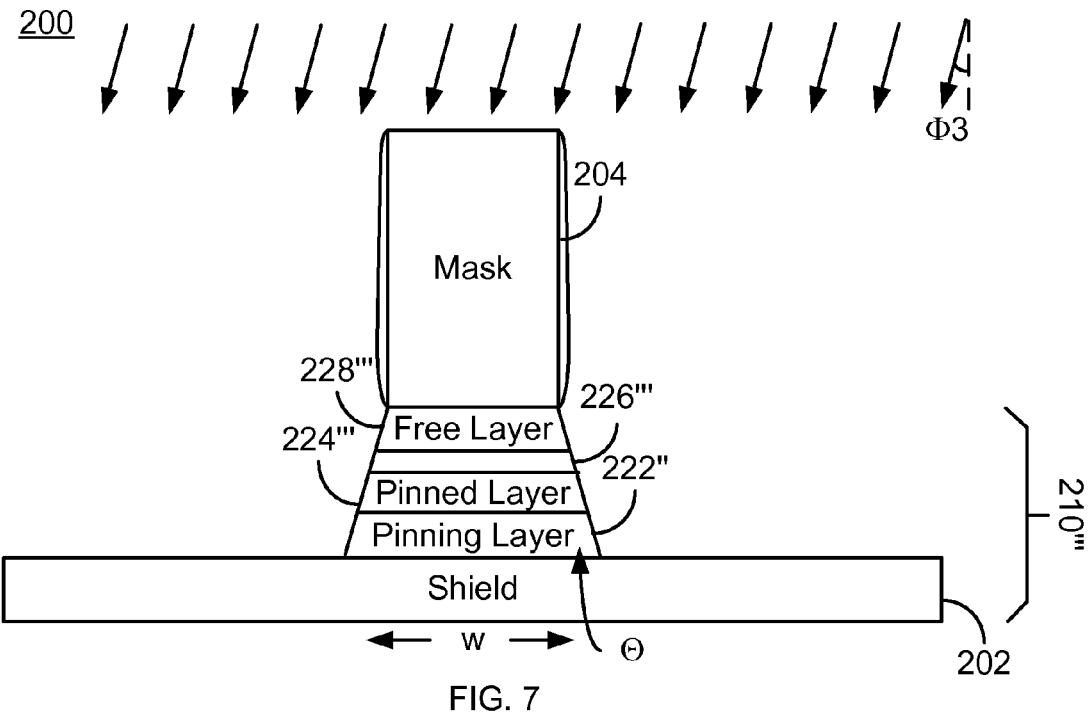

After termination of the second mill, a third mill is performed at a third angle of not more than nine degrees from normal to the surface of the magnetoresistive stack 210", via step 156. The third mill continues in step 156 until the magnetoresistive junction is completely defined. FIG. 7 depicts the read transducer 200 as step 156 is performed. Thus, the ions are incident on the magnetoresistive stack 210'" at the third angle, $\Phi 3$, from the normal. In addition, to the free layer 228'", barrier layer 226'", and pinned layer 224'" being defined, the pinning layer 222" is substantially defined. Stated differently, the magnetoresistive junction 210'" is defined. Further, the width, w, of the magnetoresistive junction 210'" may be adjusted during the second mill and, to an extent, the first mill. The first and third mills may be used to adjust the junction angle, $\Theta$. In one embodiment, the junction angle, $\Theta$, may be at least forty and not more than eighty degrees. Similarly, in one embodiment, the width is not more than sixty nanometers. In another embodiment, the width is not more than fifty nanometers.

Using the method 150, the magnetoresistive junction 210'" may be defined. Moreover, the magnetoresistive junction 210'", particularly the barrier layer 226", may exhibit less damage. Because less damage may be done during definition of the magnetoresistive junction, oxidation steps meant to repair such damage may be skipped or reduced in strength. For example, a natural oxidation instead of a plasma oxidation may be sufficient. Consequently, processing may be simplified and thick oxide layers at the sides of the junction may be reduced or avoided. In addition, redeposition 230 has been removed. Furthermore, a larger junction angle may be achieved and the width of the magnetoresistive junction 210'" adjusted. As a result, photolithography parameters may be relaxed. Fabrication may, therefore, be simplified. In addition, as can be seen in FIG. 7, the sidewalls of the magnetoresistive junction 210'" may be free of kinks.

Figure 8:
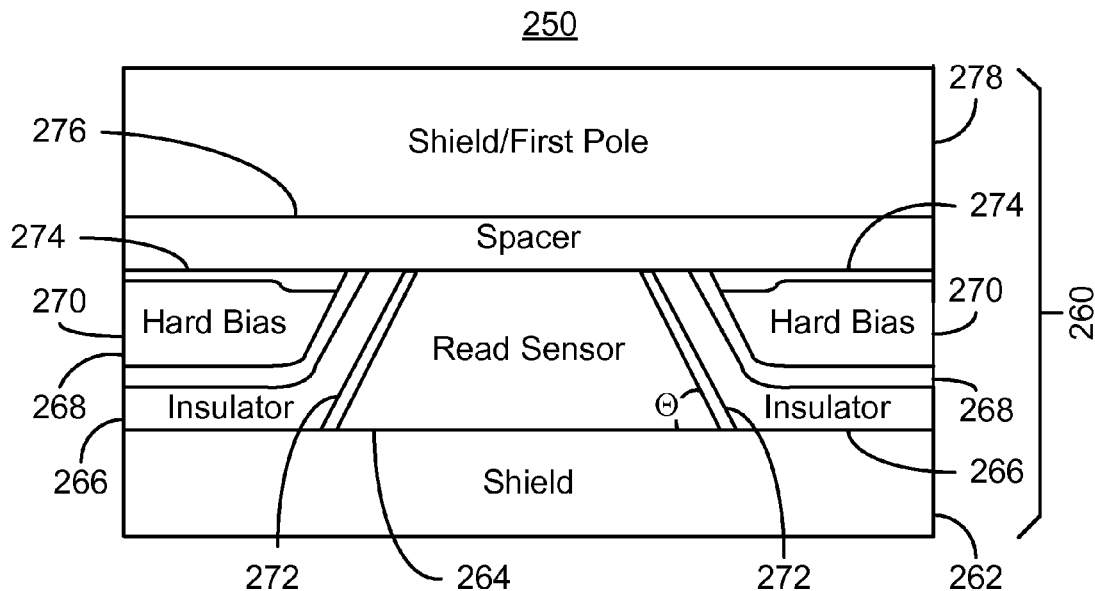

FIG. 8 depicts an exemplary embodiment of a magnetic head 250 that may be fabricated using the method 100 and/or 150. The magnetic head may also include a write transducer (not shown) and a slider. In addition, the magnetic head 250 may reside in a disk drive. The read transducer 260 is shown. The read transducer 260 includes a shield 262, a read sensor 264, an insulator 266, seed layer 268, hard bias layer 270, a hard bias capping layer 274, a metal layer 276 and an additional shield 278, which may also act as a pole for the write transducer that is not shown. The read sensor 264 is a magnetoresistive junction, such as the TMR junction 210'". Thus, in one embodiment the read sensor 264 has a junction angle of at least forty and not more than eighty degrees. Similarly, in one embodiment, the track width of the read sensor 264 is not more than sixty nanometers. In another embodiment, the width is not more than fifty nanometers. In addition, as can be seen in FIG. 8, the sidewalls of the sensor are free of kinks.

In addition, an oxide layer 272 is shown. Because the method 100 or 150 is used, the oxide layer 272 may be thin. In particular, the oxide layer 272 is not more than one nanometer thick at the free layer (not shown in FIG. 8). In the present application, a thickness of less than one nanometer at the free layer includes a zero thickness. Stated differently, the oxide layer 272 may not be present.

Because the method 100 or 150 is used, the read sensor 260 may exhibit less damage. Further, little or no redeposition may reside on the read sensor 260. Thus, shorting of the read sensor 260 may be less likely. The junction angle and track width of the read sensor 260 may also be better controlled. As a result, photolithography parameters may be relaxed. Fabrication may, therefore, be simplified. Further, because less damage may be done during definition of the read sensor 260, oxidation steps meant to repair such damage may be skipped or reduced in strength. For example, a natural oxidation instead of a plasma oxidation may be sufficient. For example, the oxide layer 272 may have a thickness of less than one nanometer. Consequently, the read sensor 272 may be better coupled with the hard bias 270. Performance of the magnetic head 250 may, therefore, be improved.

We claim:

1. A method for defining a magnetoresistive junction in a magnetic recording transducer having a surface, the method comprising:

performing a first mill at a first angle from a normal to the surface;

performing a second mill at a second angle from the normal to the surface, the second angle being larger than the first angle; and performing a third mill at a third angle from the normal to the surface, the third angle being not larger than the first angle;

wherein the third angle is not more than twelve degrees.

2. The method of claim 1 wherein at least one of the first mill, the second mill, and the third mill includes an ion mill.

3. The method of claim 1 wherein the first angle is at least twelve degrees.

4. The method of claim 3 wherein the first angle is not more than thirty degrees.

5. The method of claim 4 wherein the first angle is at least seventeen degrees and not more than twenty-five degrees.

6. The method of claim 1 wherein the second angle is at least sixty degrees.

7. The method of claim 6 wherein the second angle is not more than eighty degrees.

8. The method of claim 7 wherein the second angle is at least seventy degrees.

9. The method of claim 1 wherein the third angle is not more than nine degrees.

10. The method of claim 9 wherein the third angle is at least three degrees.

11. The method of claim 1 wherein the magnetoresistive junction includes a barrier layer and wherein the step of performing the first mill further includes:

terminating the first mill after a portion of the junction including the barrier layer is defined.

12. The method of claim 11 wherein the junction further includes a layer below the barrier layer and wherein the step of terminating the first mill further includes:

terminating the first mill before another portion of the junction including the layer is completely defined.

13. A method for defining a magnetoresistive junction in a magnetic recording transducer having a surface, the magnetoresistive junction including a barrier layer, the method comprising:

performing a first mill at a first angle from a normal to the surface, the first angle being at least twelve degrees and not more than thirty degrees, the first mill being terminated after a portion of the junction including the barrier layer is defined;

performing a second mill at a second angle from the normal to the surface, the second angle being at least sixty degrees;

performing a third mill at a third angle from the normal to the surface, the third angle being not more than nine degrees.

* * * * *